United States Patent [19]

Schulz et al.

[11] Patent Number: 5,077,173

[45] Date of Patent: Dec. 31, 1991

[54] POSITIVE PHOTORESIST CONTAINING 2,3,4-TRIHYDROXYBENZOPHENONE AND 1,2-NAPHTHOQUINONE-DIAZIDE-5-SULFONYL TRISESTER OF 1,3,5-TRIHYDROXYBENZENE

[75] Inventors: Reinhard Schulz, Reinheim; Horst Münzel, Darmstadt, both of Fed. Rep. of Germany

[73] Assignee: Ciba-Geigy Corporation, Ardsley, N.Y.

[21] Appl. No.: 649,271

[22] Filed: Jan. 30, 1991

Related U.S. Application Data

[63] Continuation of Ser. No. 325,827, Mar. 20, 1989, abandoned.

[30] Foreign Application Priority Data

Mar. 31, 1988 [DE] Fed. Rep. of Germany ....... 3811040

[51] Int. Cl.$^5$ ............................................... G03C 1/52
[52] U.S. Cl. ................................... 430/191; 430/165; 430/192; 430/193
[58] Field of Search ................ 430/191, 192, 193, 165

[56] References Cited

U.S. PATENT DOCUMENTS

| | | | |
|---|---|---|---|
| 3,130,047 | 4/1964 | Uhlig et al. | 430/193 |
| 4,587,196 | 5/1986 | Toukhy | 430/192 |
| 4,594,306 | 6/1986 | Stahlhofen et al. | 430/191 |
| 4,626,492 | 12/1986 | Eilbeck | 430/191 |
| 4,738,915 | 4/1988 | Komine et al. | 430/191 |

*Primary Examiner*—Charles L. Bowers, Jr.
*Assistant Examiner*—Christopher G. Young
*Attorney, Agent, or Firm*—Harry Falber

[57] ABSTRACT

Structures of high resolution in the near UV range and of high sharpness of edge and steepness of edge can be obtained by means of positive photoresists containing, in an organic solvent, in each case essentially at least (a) an alkali-soluble resin
(b) a 1,2-naphthoquinone-diazide-5-sulfonyl ester of a trihydroxybenzene isomer
(c) an aromatic hydroxy compound and also, if appropriate, further customary additives, and in which the result of component (b) is to give an absorption coefficient of at least 0.5 $\mu m^{-1}$ for the photobleachable absorption, and component (c) is present in a concentration of 15–30% by weight, relative to the total solids content.

2 Claims, No Drawings

POSITIVE PHOTORESIST CONTAINING 2,3,4-TRIHYDROXYBENZOPHENONE AND 1,2-NAPHTHOQUINONE-DIAZIDE-5-SULFONYL TRISESTER OF 1,3,5-TRIHYDROXYBENZENE

This application is a continuation of application Ser. No. 325,827, filed 3/20/89, abandoned.

The invention relates to positive photoresists with high resolution in the near UV.

The production of semiconductor devices and integrated circuits in microelectronics is carried out virtually exclusively with the use of photolithographic structuring processes. In order to prepare microchips having specific circuit patterns, the semiconductor substrate material, which is generally silicon wafers, is coated with photoresist and photoresist relief structures are produced thereon by image-wise exposure and subsequent development. These structures serve as a mask for the actual structuring processes on the semiconductor substrate, such as etching, doping or coating with metals or other semiconductor or insulating materials. In these processes the photoresist masks are removed again, if necessary. The circuit patterns of the microchips are formed on the substrate by means of a large number of process cycles of this type.

In principle, two different types of photoresists are distinguished: In positively operating photoresists the exposed areas are dissolved away by a development process, whereas the unexposed areas remain as a layer on the substrate. In negatively operating photoresists, conversely, the irradiated areas of the layer remain as a relief structure. By virtue of their nature, positive photoresists possess a higher image resolution and are therefore mainly employed in the production of VLSI circuits.

Positive photoresists of the customary type contain, in an organic solvent, in each case essentially at least one resin soluble in aqueous alkalis and a photosensitive quinone-diazide compound which reduces the solubility in alkali of the resin. As a result of the action of radiation on photoresists produced by means of compositions of this type the solubility in alkali in the exposed areas is increased through photoinduced structural transformation of the quinone-diazide compound into a carboxylic acid derivative, so that, after development in aqueous alkaline developing baths, positive photoresist relief structures are obtained.

Photosensitive quinone-diazide compounds in use are preferably esterification products of 1,2-naphthoquinone-2-diazide-5-sulfonic acid or 1,2-naphthoquinone-2-diazide-4-sulfonic acid with low-molecular aromatic hydroxy compounds, in particular hydroxybenzophenones, such as 2,3,4-trihydroxybenzophenone and 2,3,4,4'-tetrahydroxybenzophenone and also trihydroxybenzenes. These naphthoquinone-diazide compounds have a broad absorption in the near to medium UV wavelength range between approx. 300 and 450 nm. Strong emission lines of the mercury vapour lamps customarily employed in the projection equipment, such as, for instance, the lines at 313 nm, 334 nm, 365 nm, 405 nm, and 436 nm, are located within this wavelength range.

Furthermore, positive photoresists can usually also contain modifying additives, especially additives for increasing the sensitivity and for controlling the development rate and also radiation-absorbing agents and dyes for suppressing reflection and scattering effects which reduce resolution.

The characteristics of a photoresist which are essential for applicability in industry are sensitivity to radiation, image resolution and contrast.

A high sensitivity is important in order to ensure short irradiation times in manufacturing process cycles and also, for instance, if, by virtue of the technical characteristics of the equipment, only radiation of a fairly low intensity, for example in the case of monochromatic exposure, can act on the resist.

The image resolution characterizes the degree to which the dimensions of the smallest image structures in the original, such as, for instance, lines and interspaces, can be clearly separated and reproduced true to dimensions by the photoresist in the form of ridges and trenches. The production of VLSI circuits requires the reproduction of structural details of an order of magnitude of 1 $\mu$m or less.

The contrast characterizes the steepness of edges and sharpness of edges in the photoresist relief structures obtained after development. These should be as sharp-edged as possible and in the ideal case should have 90° flanks.

The resolution which can be achieved in the production of photoresist structures depends primarily on the specific properties of the material of the photoresist, such as, in particular, the absorption and quantum yield of the radiation initiating the reaction and the development behaviour; its lower limit is determined by the optical quality of the exposure equipment and, in theory, by the wavelength of the radiation used. Lens systems designed for the highest requirements in the case of monochromatic exposure must have a high numerical aperture. However, as the numerical aperture increases, the depth of focus and hence the focussing tolerance required for use under production conditions, falls off considerably. It is not possible to achieve a higher resolution by using radiation of a lower wavelength, such as, for instance, UV radiation in the far region or X-rays, with the customary positive photoresists because of their photochemical properties and with the customary exposure equipment which operates in the near UV by means of radiation of the mercury spectrum. Practical limits are thus set to increasing resolution by means of optical measures.

The positive photoresists which are customary at the present time and based on an alkali-soluble resin and naphthoquinone-diazide compounds make possible resolution down to 0.8–0.9 $\mu$m when exposed in the near UV range using lenses of a numerical aperture of 0.3–0.4. With the demand for an increasingly higher integration density on microchips there is, therefore, a great need for positive photoresists of higher resolution which can be structured within the near UV range and, in particular, can be processed in the wafer steppers which are employed to a large extent in mass production and which are mainly operated on a monochromatic basis using the radiation of the mercury G line (436 nm). For the sub-micrometer range an improvement in resolution by 0.1–0.3 $\mu$m compared with the state of the art ranks as considerable in this respect. It was, therefore, required to improve positive photoresists according to the state of the art in such a way that they exhibit a markedly increased resolution in the near UV range and also provide structures of great sharpness of edge and steepness of edge in the region of maximum resolution.

It has now been found, surprisingly, that positive photoresists essentially containing, in an organic solvent, in each case at least
(a) an alkali-soluble resin,
(b) a 1,2-naphthoquinone-diazide-5-sulfonyl ester of a trihydroxybenzene isomer,
(c) an aromatic hydroxy compound
and, if appropriate, further customary additives exhibit a considerably improved resolution when exposed to radiation in the near UV range, if the result of component (b) in them is to give an absorption coefficient of at least 0.5 $\mu m^{-1}$ for the photobleachable absorption and if component (c) is present in a concentration of 15-30% by weight, relative to the total solids content.

Positive photoresists having a composition of this type make it possible to reproduce structural details down to at least 0.6 $\mu m$ with sharp edges and with flanks of virtually 90° without problems when exposed to the G line at a numerical aperture of 0.35.

Admittedly positive photoresists containing the components (a), (b) and (c) indicated are already known from German Patent Application P 3,724,791; the positive photoresists described therein had, however, a different quantitative composition and accordingly did not exhibit the desired high resolution either. Nor can the desired high resolution be achieved even with photoresists of a similar composition in respect of absorption coefficient and content of aromatic hydroxy compound, but containing naphthoquinone-diazide-sulfonyl esters of hydroxybenzophenones, as described, for instance, in U.S. Pat. No. 4,626,492.

The invention therefore relates to positive photoresists containing, in an organic solvent, in each case essentially at least
(a) an alkali-soluble resin
(b) a 1,2-naphthoquinone-diazide-5-sulfonyl ester of a trihydroxybenzene isomer,
(c) an aromatic hydroxy compound
and, if appropriate, further customary additives, wherein the result of component (b) is to give an absorption coefficient of at least 0.5 $\mu m^{-1}$ for the photobleachable absorption and component (c) is present in a concentration 15-30% by weight, relative to the total solids content.

The invention relates in particular to positive photoresists of this type in which the component (b) is the 1,2-naphthoquinone-diazide-5-sulfonyl triester of 1,3,5-trihydroxybenzene and the component (c) is 2,3,4-trihydroxybenzophenone.

The invention also relates to the use of positive photoresists of this type as photoresists of high resolution in the near UV range.

The invention relates, additionally, to a process for the production of photoresist relief structures having a resolution down to at least 0.6 $\mu m$ by coating a semiconductor substrate with a positive photoresist, exposing the coating imagewise to radiation from the near UV wavelength range and developing with an aqueous alkaline developer, using a positive photoresist as characterized above.

As is familiar to those skilled in the art, one parameter by means of which the image-forming properties of a positive photoresist can be characterized very well is the absorption coefficient of the photobleachable absorption, the A-value, for a predetermined wavelength of irradiation (in this regard see, for example: F. H. Dill, W. P. Hornberger, P. S. Hauge, J. M. Shaw, IEE Trans. Electr. Dev. ED-22, 445 (1975)). The A-value contains the molar extinction specific to the compound and the concentration of the photoreactive component of the photoresist. This absorption falls off during the irradiation of the photoresist because of the photo-induced transformation. In addition, a part is also played by the absorption coefficient of the non-photobleachable absorption, the B-value. This contribution to the total absorption at the wavelength of the irridation originates from the photolysis product of the photoreactive component(s) and from the other, non-photoreactive constituents of the photoresist, for example added dyes.

It is known that better results in respect of sharpness of edges and steepness of flanks can be achieved with positive photoresists, and also that they are less critical in regard to the tolerance of focussing, if they have a high A-value. Photoreactive components having a high content of radiation-sensitive groups in the molecule, for example naphthoquinone-diazide-sulfonyl triesters and tetraesters of aromatic hydroxy compounds naturally have a high molar extinction for the photobleachable absorption and therefore require a lower total concentration in the photoresist in order to adjust the A-value to a specific figure than, for example, the monoesters or bisesters. It should, therefore, also be possible to achieve a higher resolution of structures with a theoretically consequent higher differential solubility by means of a high local concentration of photoreactive component. It has been found, however, that, in the presence of high concentrations of customary naphthoquinone-diazide-sulfonyl esters of trihydroxybenzophenones or tetrahydroxybenzophenones, which are normally not single-substance products, but mixtures of the complete and partial esters, no structures of the desired resolution with high sharpness of edges and steepness of edges can be obtained because of the increased developer solubility of this resist. On the other hand, photoresists containing a high concentration of the naphthoquinone-diazide-sulfonyl triesters of the trihydroxybenzenes, which can be obtained as single-substance products, prove to be virtually no longer capable of development. In accordance with the invention it was only possible to obtain structures having a resolution down to at least 0.6 $\mu m$ with a high sharpness of edges and steepness of edges as a result of adding aromatic hydroxy compounds which increase the rate of developing in a concentration of 15-30% by weight, relative to the total solids content of the photoresist and if the A-value is adjusted to at least 0.5 $\mu m^{-1}$ by means of naphthoquinone-diazide-sulfonyl esters of trihydroxybenzene isomers.

The positive photoresists according to the invention contain, in an organic solvent, as the resin component an alkali-soluble resin, as the photosensitive component a 1,2-naphthoquinone-diazide-5-sulfonyl ester of a trihydroxybenzene isomer in a content which results in an absorption coefficient of at least 0.5 $\mu m^{-1}$ for the photobleachable absorption, and an aromatic hydroxy compound which increases the rate of developing in a concentration of 15-30% by weight, relative to the total solids content. If appropriate, they can also contain further customary additives by means of which it is possible, if appropriate, to adjust the properties of the photoresist to specific requirements of the end use.

The resin component is, in principle, any alkali-soluble resin which is customary in the technology of photoresists, for example novolak resins which are obtained by subjecting phenol or phenolic compounds to a condensation reaction with aldehydes. Cresol-formaldehyde resins in the preparation of which o-, m- or p-cresol or mixtures of these isomers are employed in any desired or predetermined ratios are preferred. The preparation of such resins and their use in positive photoresists is described, for example, in U.S. Pat. No. 4,377,631. In addition, other alkali-soluble resins such as are frequently used in positive photoresists are also suitable. These include, for instance, poly-(vinylphenols) and polyglutarimides, copolymers formed from styrene and α-methylstyrene with maleimide and copolymers formed from N-(p-hydroxyphenyl)-maleimide and olefins. It is also possible to use silylated derivatives of alkali-soluble polymers having a fairly high resistance to plasma etching. The resin component forms a proportion of about 40–70% by weight, relative to the total solids content, in the positive photoresists according to the invention.

The photosensitive components employed in the positive photoresists according to the invention are 1,2-naphthoquinone-diazide-5-sulfonyl esters of trihydroxybenzene isomers. They can be the triesters of 1,2,3-, 1,2,4- and 1,3,5-trihydroxybenzene. These compounds are known and can be obtained as pure, complete esters in a simple manner by esterifying the corresponding trihydroxybenzene isomers with 1,2-naphthoquinonediazide-5-sulfonyl chloride. The isomeric forms of these triesters are normally employed in a pure state, but can also be used as a mixture with one another. Their use in the positive photoresists according to the invention is effected in a proportion such that the result is an absorption coefficient of at least 0.5 $\mu m^{-1}$ for the photobleachable absorption. The A-value to be obtained is preferably within the range between 0.55 and 0.75 $\mu m^{-1}$ at a wavelength of irradiation of 436 nm. This is the case, depending on the slightly varying molar extinctions of these isomers, above a content of about 17% by weight, relative to the total solids content. The 1,2-naphthoquinone-diazide-5-sulfonyl triester of 1,3,5-trihydroxybenzene is the preferred radiation-sensitive component. This ester is preferably employed in a concentration of 17–30% by weight, relative to the total solids content.

The positive photoresists according to the invention also contain, in order to increase the rate of development, an aromatic hydroxy compound in a proportion of 15–30% by weight, relative to the total solids content.

These are principally compounds of the formula I

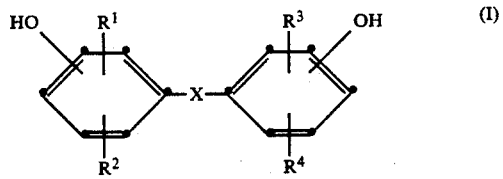

in which X is a single bond, —O—, —S—, $SO_2$, CO or $CR_5R_6$, $R^1$, $R^2$, $R^3$ and $R^4$ are each H, halogen, $C_1$–$C_4$alkyl, $C_1$–$C_4$alkoxy or OH and $R^5$ and $R^6$ are each H, $C_1$–$C_4$alkyl or $C_1$–$C_{14}$perfluoroalkyl.

The compounds of the formula I are bisphenyl compounds in which each phenyl ring carries at least one hydroxyl group and in which the two phenyl rings are linked via a bridge X which can be a single bond, an oxygen or sulfur atom, a sulfonyl or carbonyl group or a methylene group which is unsubstituted or substituted by $C_1$–$C_4$alkyl or $C_1$–$C_4$perfluoroalkyl. Insofar as they are not hydrogen, the radicals $R^1$, $R^2$, $R^3$ and $R^4$ can be halogen, such as fluorine, chlorine or bromine, $C_1$–$C_4$alkyl, such as methyl, ethyl, n-propyl, isopropyl or n-, iso- or t-butyl, $C_1$–$C_4$-alkoxy, such as methoxy, ethoxy, n-propoxy, iso-propxy or n-, iso- or t-butoxy, and OH.

The compounds of the formula I preferably contain two, three or four OH groups and in other respects no further substituents. The OH groups preferably occupy the 4,4'-, 2,2'-, 2,3,4- or 2,2',4,4'-positions. Preferred additives are, for instance, the compounds 2,3,4-trihydroxybenzophenone, 4,4'-dihydroxybiphenyl, 2,2'-dihydroxybiphenyl, 4,4'-dihydroxybenzophenone, bis-(4-hydroxyphenyl) ether, bis-(4-hydroxyphenyl) sulfide, bis-(2,4-dihydroxyphenyl) sulfide, bis-(4-hydroxyphenyl) sulfone or 2,2-bis-(4-hydroxyphenyl)-propane. 2,3,4-Trihydroxybenzophenone, bis-(4-hydroxyphenyl) sulfone, 4,4'-dihydroxybenzophenone and bis-(2,4-dihydroxyphenyl) sulfide are particularly preferred and of these 2,3,4-trihydroxybenzophenone is particularly preferred.

The positive photoresists according to the invention typically contain 50 to 65% by weight of an alkali-soluble resin, 18 to 25% by weight of the 1,2-naphthoquinone-diazide-5-sulfonyl triester of 1,3,5-trihydroxybenzene and 17 to 25% by weight of 2,3,4-trihydroxybenzophenone, in each case relative to the total solids content.

Solvents suitable for the preparation of the photoresist solution are, in principle, any solvents in which the solid photoresist constituents, such as the alkali-soluble resin, the quinone-diazide compound, the aromatic hydroxy compound and, if appropriate, further additives are adequately soluble and which do not react irreversibly with these constituents. Examples of solvents suitable for this purpose are aliphatic ketones, such as methyl ethyl ketone, cyclopentanone or cyclohexanone, aliphatic esters, such as butyl acetate, ethers, such as anisole or tetrahydrofuran, alcohols such as n-propanol or isopropanol, mono ethers or bis ethers and mixed ether-ester derivatives of glycol compounds such as ethylene glycol, diethylene glycol or propylene glycol, also monooxycarboxylic acid esters, such as, for instance, ethyl lactate or ethyl 2-ethoxypropionate, lactones, such as γ-butyrolactone, or cyclic amides, such as 2-methylpyrrolidone. Aliphatic and aromatic hydrocarbons, such as n-hexane and xylene, are also used as solvents. Mixtures of the said solvents are also frequently used. Photoresist solvents commonly contain ethoxyethyl acetate, methoxypropyl acetate or ethylene glycol dimethyl ether. The solvent is usually present in a proportion of 40–90% by weight of the total photoresist solution.

The further customary additives which can also be present in the photoresists according to the invention include, for instance, substances which absorb scattered radiation, dyes, flow control agents, plasticizers, adhesion promoters, further film-forming resins, surfactants and stabilizers. Additives in these categories are adequately known to those skilled in the art and are widely described in the relevant specialist literature. The proportion of additives of this type, taken together, hardly exceeds 25% by weight, relative to the total solids content of the photoresist solution.

The positive photoresists according to the invention are formulated in a manner known per se by mixing or dissolving the components in the solvent or solvent mixture. After dissolving the constituents in the solvent, the resultant photoresist solution is filtered through a membrane filter of pore width 0.1–1 μm, depending on the extent to which it must be free from particles. Customarily, the total solids content of the photoresist is adjusted to suit the desired layer thickness and coating method.

The application is effected in a manner known per se and using the process equipment customary for this purpose, by coating a substrate with the photoresist solution, drying the layer at an elevated temperature, exposing the layer imagewise to radiation of a wavelength range in which the layer is sensitive and developing with an aqueous alkaline developer.

The substrates used are mainly semiconductor wafers, for example silicon wafers, which, if desired, can be coated with a layer of silicon dioxide, silicon nitride or aluminium. Other materials customary in the production of miniaturized circuits, such as germanium, gallium arsenide or ceramics, if appropriate with a noble metal coating, are also suitable.

Coating is normally effected by dipping, spraying, rolling or whirler-coating. In the latter method of coating, which is the most frequently used, the resulting layer thickness depends on the viscosity of the photoresist solution, the solids content and the whirler-coater speed. So-called whirler curves are determined for each particular photoresist, and from these the resist layer thicknesses can be determined as a function of viscosity and whirler speed of rotation. The layer thicknesses for positive photoresists are typically within the range from 0.5 to 4 μm, especially 0.6–2.0 μm.

After the photoresist has been applied to the substrate it is normally subjected to preliminary drying at temperatures between 70° C. and 130° C. It is possible to use ovens or hotplates for this purpose. The drying time in ovens is within a range of about 15–45 minutes and on hotplates is within a range of about 0.5–4 minutes. It is preferable to dry for about 1 minute at about 100° C. on a hotplate.

The positive photoresists according to the invention are preferably exposed to monochromatic light at 436 nm, when their excellent resolution properties become evident in a particularly advantageous manner.

The substrates coated with the photoresist and exposed are finally developed with an aqueous alkaline developer solution, for example by dipping or spraying, until the resist in the exposed areas has been completed dissolved away. Various developer formulations belonging to the class of photoresist developers either containing metal ions of free from metal ions can be used. Developers containing metal ions are aqueous solutions of sodium hydroxide or potassium hydroxide which can also contain pH-regulating and buffering substances, such as phosphates or silicates, and also surfactants and stabilizers. Developers free from metal ions contain, instead of alkaline metal compounds, organic bases, for example tetramethylammonium hydroxide or choline. The development times depend on the exposure energy, the strength of the developer, the type of development, the pre-drying temperature and the temperature of the developer. Development times of about 1 minute are typical in the case of dip development. Development is usually stopped by immersion in or spraying with deionized water. Development is frequently followed by an after-drying at about 100° C. to 180° C.

Relief structures produced by means of the photoresists according to the invention exhibit an excellent image resolution down to at least 0.6 μm with a high contrast and high steepness of edge and sharpness of edge. The loss of layer thickness in the unexposed areas is minimal. In the subsequent process sequences in the production of integrated semiconductor circuits, such as etching with acid or in plasma, doping or coating, the photoresists exhibit excellent properties and ensure effective protection of the areas of the substrate which are covered by the photoresist relief structures.

EXAMPLES

A. Photoresist formulations

Unless otherwise specified, photoresist formulations were prepared from the components (a) an m-kresol Novolak resin of average molecular weight $M_w = 9000$ (b) the 1,2-naphthoquinone-diazide-5-sulfonyl trisester of 1,3,5-trihydroxybenzene and (c) 2,3,4-trihydroxybenzophenone in the percentages indicated under C, relative to the total solids content, in the form of 35% solutions in diethylene glycol dimethyl ether, and these solutions were filtered through filters having a pore width of 0.2 μm.

B. Test methods

The photoresist formulations were whirler-coated onto surface-oxidized silicon wafers of diameter 4", the whirler speed of rotation being so chosen that, after drying on a hotplate for 1 minute at 100° C., a layer thickness of 1.5 μm resulted in each case. The layer was then exposed through a resolution test mask to monochromatic light of 436 nm using a lens system of numerical aperture NA=0.35 and was then developed by immersion in 1.62% aqueous tetramethylammonium hydroxide solution at 20° C. for 60 seconds.

The resulting resist structures were inspected under a scanning electron microscope in regard to resolution and sharpness of edge.

C. Results

The table below shows the resulting absorption coefficients for the photobleachable absorption (A-value) and the maximum image resolution together with characterization of the edge profiles for photoresist formulations according to the invention (Examples 1 and 2) and also comparison formulations (Examples 3 to 6), at varying percentages of the components (a), (b) and (c).

| Example | Components (% by weight) | | | A-value | Resolution/edge profile |
|---|---|---|---|---|---|
| | (a) | (b) | (c) | | |
| 1 | 60.0 | 18.0 | 22.0 | 0.54 | 0.6 μm/vertical edges |
| 2 | 62.4 | 18.6 | 19.0 | 0.56 | 0.6 μm/vertical edges |
| 3 | 72.0 | 10.0 | 18.0 | 0.30 | 0.8 μm/no vertical edges; not dimensionally stable |
| 4 | 70.2 | 14.4 | 15.4 | 0.41 | 0.9 μm/no vertical edges |
| 5 | 67.0 | 21.0 | 12.0 | 0.65 | 0.9 μm/vertical edges |
| 6 | 68.0 | 20.4* | 11.6 | 0.65 | 0.9 μm/no vertical edges |

*Esterification product of 1 mol of 2,3,4,4'-tetrahydroxybenzophenone with 3 mol of 1,2-naphthoquinone-diazide-5-sulfonyl chloride.

It is found that structures of a resolution down to 0.6 μm and having a vertical and sharp edge profile can only be obtained with the positive photoresist formulations according to the invention.

What is claimed is:

1. A positive photoresist comprising, in an organic solvent, (a) an alkali-soluble resin, (b) 1,2-naphthoquinone-diazide-5-sulfonyl trisester of 1,3,5-trihydroxybenzene, and (c) 2,3,4-trihydroxybenzophenone; component (b) and component (c) each being present in a concentration of 17–30% by weight, relative to the total solids content.

2. A positive photoresist according to claim 1, which contains (a) 50 to 56% by weight of an alkali-soluble resin,
(b) 18 to 25% by weight of the 1,2-naphthoquinonediazide-5-sulfonyl triester of 1,3,5-trihydroxybenzene and
(c) 17 to 25% by weight of 2,3,4-trihydroxybenzophenone, in each case relative to the total solids content.

* * * * *